United States Patent [19]

Iadarola

[11] Patent Number: 4,556,759

[45] Date of Patent: Dec. 3, 1985

[54] PADLESS PLATED VIAS HAVING SOLDERED WICKS FOR MULTI-LAYER PRINTED CIRCUIT BOARDS

[75] Inventor: Ralph E. Iadarola, Roseland, N.J.

[73] Assignee: Allied Corporation, Morris Township, N.J.

[21] Appl. No.: 627,131

[22] Filed: Jul. 2, 1984

[51] Int. Cl.[4] .............................................. H05K 1/00
[52] U.S. Cl. .................................... 174/68.5; 361/414
[58] Field of Search ............... 174/68.5; 361/398, 401, 361/414; 29/852

[56] References Cited

U.S. PATENT DOCUMENTS

| 3,429,038 | 2/1969 | Dugan et al. | 29/852 |
| 3,447,960 | 6/1969 | Tonozzi | 117/212 |
| 3,508,330 | 4/1970 | Kubik | 174/68.5 |
| 3,888,639 | 6/1975 | Hastings et al. | 361/414 |
| 4,298,770 | 11/1981 | Nishihara et al. | 174/68.5 |

FOREIGN PATENT DOCUMENTS 477056 8/1974 Australia .............................. 174/68.5

OTHER PUBLICATIONS

Joe Keller, Lifted Plated Through Holes–Yea or Nay? Printed Circuit Fabrication, Nov. 1983, pp. 98 and 100.

Primary Examiner—A. T. Grimley
Assistant Examiner—Morris H. Nimmo
Attorney, Agent, or Firm—Stanley N. Protigal; Howard G. Massung

[57] ABSTRACT

A multi-layer printed circuit board (21) has through holes (15-17) which are plated without conventional pads. This avoids circuit board rejections which would occur from cosmetic defects resulting from incomplete solder coverage of the pads and from pad lifting. In order to provide the through holes (15-17) with an adequate supply of solder during solder operations, wicks (45) are provided for each through hole (15-16) which is isolated from circuit traces (37, 38) on the exterior surface (33) of the printed circuit board (21). If the through hole (17) is connected to a circuit trace (38) on the exterior surface (33), then a connecting run (48) is used to provide wicking action in lieu of a tab (45).

9 Claims, 3 Drawing Figures

PADLESS PLATED VIAS HAVING SOLDERED WICKS FOR MULTI-LAYER PRINTED CIRCUIT BOARDS

BACKGROUND OF THE INVENTION

This invention relates to printed circuit boards, and more particularly to plated through holes or "vias" used on multi-layer printed circuit boards.

Typically through holes are drilled through conductive layers within the printed circuit board and are used to effect soldered connections between the boards and the devices to be mounted to the boards. These through holes are then plated, usually by electroless plating techniques. This plating results in vertical conductors or "vias" being deposited on the through holes. "Vertical" refers to the direction normal to the top surface of the board. In usual practice, a "pad" is formed on the outer surface of the printed circuit board when each hole is plated. This results in a significant surface area on the outer layer of the board, as shown in FIG. 1. These pads therefore reduce the available area on the outer layer of the printed circuit board. More importantly, these pads must be completely covered with solder in order to avoid a cosmetic defect in the finished product. The pads are also prone to lifting, another defect. For these reasons, the pads have been a major source of rejections of printed circuit boards. It has been found that once the through holes are soldered, the pads do not significantly contribute to the integrity of the printed circuit board's circuitry. The existance of a pad surrounding a through hole allows solder to completely cover the hole without penetrating the hole, thus masking a defective connection.

The pads do have one benefit; that is, they provide an easy place to wick solder into the through hole. In cases where the purpose of the through holes is to provide a via solely for interconnection between layers of the printed circuit board, the wicking capability of the pads has little significance because it is possible to use electroless plating techniques in order to provide enough conductive material to mechanically strengthen the via. In other cases the via is used for effecting connections of circuit components onto the board. In such cases, the ability to wick solder into the via is important because, without the wicking of solder into the via, a circuit component would not be firmly attached to the printed circuit board. Therefore, padless printed circuit boards eliminate some of the problems of circuit board pads at the expense of detracting from the solder wicking characteristics inherent in boards having padded plated through holes.

It should be pointed out that, while such boards are designed without pads, the plating on the through holes sometimes extends on the top or "solder side" of the printed circuit board beyond the outer circumference of the through hole. These holes are nevertheless considered to be not padded as long as the extension of the plating on the exterior surface of the printed circuit board is less than twice the thickness of the plating material itself.

SUMMARY OF THE INVENTION

This invention contemplates a multi-layer printed circuit board having plated through holes which are soldered by flow soldering techniques. The top surface, referred to as the "solder side", of the printed circuit board is provided with wick tabs in the form of plating material which are in communication with the plated material on the through holes which are to be soldered. The wick tabs provide the necessary wicking action, while presenting a significantly reduced surface area on the solder side of the board which is required to show solder when the through holes are soldered.

Advantages include reduced rejection rate of printed circuit boards due to cosmetic defects. The padless arrangement makes it improbable that solder connections at the through holes cover the through hole without penetrating into the hole. The inventive arrangement provides a wicking action such as is characteristic with padded through holes, and yet allows higher circuit densities by eliminating the dimensions of the pads.

DETAILED DESCRIPTION OF THE PREFERRED EMBODIMENTS

Figure 1:
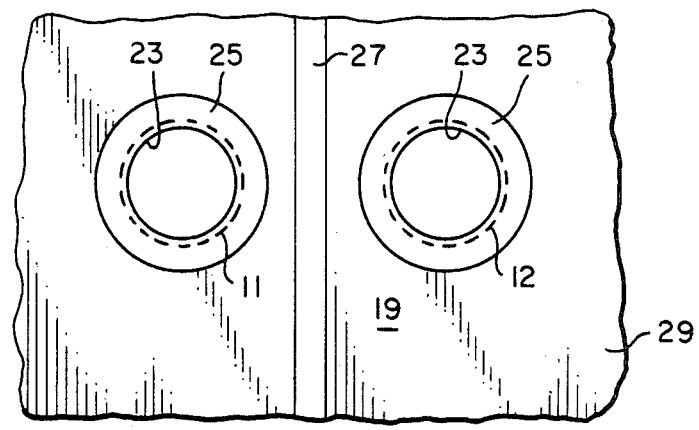
FIG. 1 is a top view of a section of a prior art printed circuit board, showing conventional padded plated through holes and a single circuit run.
Figure 2:
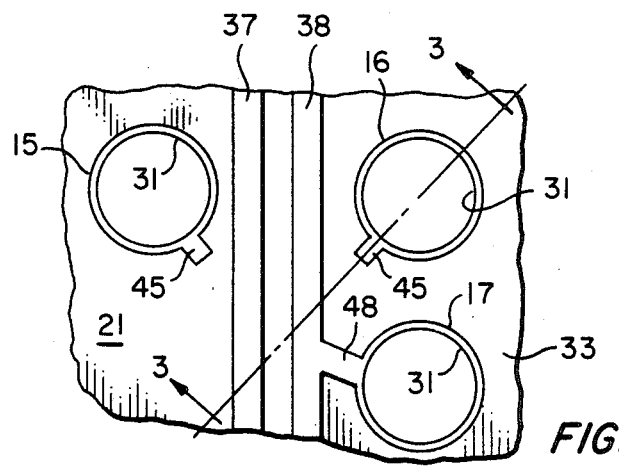
FIG. 2 is a top view, similar to the view of FIG. 1, showing a section of a printed circuit board and a pair of padless plated through holes formed in accordance with the present invention.

The present invention is directed to the plating of through holes, such as holes 11 and 12 shown in FIG. 1 or holes 15, 16 and 17, shown in FIG. 2. These holes are drilled in printed circuit boards such as multi-layer printed circuit board 19 shown in FIG. 1 or multi-layer printed circuit board 21 shown in FIGS. 2-3. This drilling establishes an outer border for the holes at the dashed lines 11, 12.

Referring to FIG. 1, after the holes 11, 12 have been drilled, it is conventional to plate these holes 11, 12 with conductive material which forms a via 23 and pad 25 on each hole 11-12. This plating is typically accomplished by using electroless plating techniques. Electroless plating techniques are also used to deposit conductor runs, such as run 27 on the top surface 29 of the board. The conductor runs 27 and the pads 25 are part of a circuit trace pattern on the top surface 25 of the board 19. The board 19 has a plurality of circuit trace patterns, each located at a different layer. After the electroless plating, the conductors are often plated a second time, either by electroless plating, electro-plating or by soldering. The vias 23 extend vertically into the individual holes 11, 12, the vertical direction being normal to the top surface 29 of the board 19 can conduct between conductor runs on various conductive layers (not shown in FIG. 1).

The plated material, forming the vias 23, pads 25 and other plated conductors such as run 27, has a significant physical thickness, as can best be seen by the distance of the inner diameter of the vias 23 from the through hole boarders 11, 12. This thickness is typically 0.075 mm, although this dimension can vary greatly in accordance with the plating technique used. The pads typically have a width which is 0.5 mm, resulting in a pad diameter being 1.75 mm for a via having an inside diameter of 0.75 mm. Typically, conductor runs, such as run 27, have a width of 0.25 mm. In order to avoid shorting from solder bridging, inaccuracies in the conductor pattern and the like, the plated conductors 25, 27 on the top surface are provided with a spacing which typically is 0.25 mm. Therefore, if the through hole has a center-to-center spacing of 2.5 mm, than only a single circuit run 27 can be fit between the adjacent plated through holes 11, 12.

Figure 3:
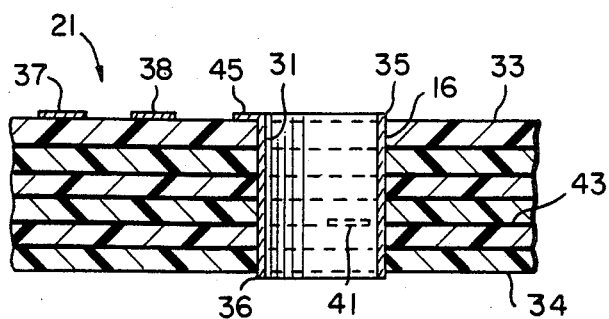
FIG. 3 is a side view of a padless plated through hole, taken along section 3—3 of FIG. 2.

Referring to FIGS. 2-3, in accordance with the present invention, the through holes 15-17 are plated without pads. As can be seen, the plating results in vias 31 which have a physical dimension resulting from the thickness of the plating material. Despite this dimension, the vias 31 terminate at their outer diameters, which is at the border of at their corresponding through holes 15-17. As shown in FIG. 3, it is possible that these vias 31 may overlap the outer surfaces 33, 34 of their printed circuit board 21 slightly, forming lips 35, 36. These lips 35, 36 are, however, the result of plating technique and are not expected to extend beyond the outer diameter of the through holes 16 more than a dimension equal to twice the thickness of the plating material. Thus, by producing the vias 31 without pads 25 (FIG. 1), it is possible to provide two runs 37, 38 while maintaining the same dimensions and hole spacing as is shown and described in connection with FIG. 1.

Referring to FIG. 3, the plating at the through hole 16 is maintained as if the via 31 had a pad associated with it. Therefore, if the via 31 is intended to effect a connection with a conductor 41 on an internal layer 43 of the board 21, continuity is established in a conventional manner.

On the other hand, the ability of solder to flow into the vias 31 is dependent upon the surface area of the vias 31 at the outer surface of the printed circuit board 21. For this reason, each plated through hole 15, 16 is provided with a tab 45 which is plated on to the printed circuit board 21 and is in physical continuity with its via 31. The tabs 45 present significant surface area on the top surface 33 of the printed circuit board 21. The tabs 45 extend partically around the through holes 15-16, for example, by less than ¾ way and preferrably by less than ½ way around the outer diameters of the holes 15-16. Preferrably, the tabs 45 extend by a width of at least 0.1 mm and less than 0.5 mm about each 15-16. More preferrably, the tabs 45 are between 0.15 mm and 0.3 mm in width, causing these tabs 45 to extend less than ¼ way around the outer diameters of the holes 15-16. The tabs 45 extend away from the vias 37 to a length of at least three times the thickness of the vias 31. Therefore, when the top surface 33 is exposed to solder, the tabs 45 attract the solder. This breaks the solder's surface tension and thereby causes the solder to wick from the tabs 45 to the vias 31. At the vias 31 osmotic pressure causes the solder to coat the inside diameter of each via 31 which is thereby exposed to solder, provided that soldering conditions are otherwise favorable. Thus, if a wire (not shown) extends into the inside diameter of one of the plated through holes 16, the solder can flow so as to create a physical continuity between the via 31 and the wire. Since the via 31 does not have any continuous pad area surrounding the through holes 15, 16, there is little possibility that solder can appear to connect such a wire to its via 31 without penetrating into the inside diameter of the plated through hole 15 or 16 which forms the via 31. Furthermore, mechanical forces exerted by such a wire are transferred to the board 21 through the via 31, rather than through a pad, thus reducing the possibility of the wire lifting portions of plated material from the board 21.

The tabs 45, of course do not have to be provided on those holes which are attached to one or more circuit traces 48 on the solder side 33 of the board 21, because that circuit trace 48 would provide the wicking characteristics otherwise obtained from the tabs 45. There are, of course, cases in which few or no circuit traces on the solder side 33 will be connected to through holes, in which case, the tabs 45 would provide the solder wicking properties.

There are cases in which pads (not shown) would be provided for the purpose of attaching electrical connections or contact points for electrical probes. Such pads may be provided either separately from the through holes 15-17 or may extend from such a through hole. By using the present invention, it is nevertheless possible to avoid such pads at one or more through holes.

What is claimed is:

1. Multi-layer printed circuit board having a plurality of conductive traces, the conductive traces being located on a plurality of circuit layers interspaced with a plurality of insulative layers, and having a plurality of through holes which have outer boundaries and extend substantially vertically through the board to communicate with one or more of said conductive traces and with an exterior surface of the board, the through holes having an outer border which has a perimeter at said exterior surface, said through holes being plated with a conductive material of a thickness to form vias, the vias having an inner boundary forming a hole and an outer boundary, characterized by:

said outer boundary of the vias terminating before the via hole's outer border plus twice said thickness of said conductive material and;

said termination being interrupted by a tab which extends partially around the via hole's outer border and extends beyond said border by more than three times the thickness of said conductive material said tab providing sufficient surface area on said exterior surface of the board to attract solder and thereby causing the solder to wick from the tab to the via by breaking the solder's surface tension, whereby osmotic pressure in the via causes the solder to coat the inner boundary.

2. Apparatus as described in claim 1, further characterized by:

the printed circuit board being a rigid printed circuit board.

3. Apparatus as described in claim 1, further characterized by:

the printed circuit board being a flexible printed circuit board.

4. Apparatus as described in claim 1, further characterized by:

said through holes extending through the board from said exterior surface to an opposite exterior surface.

5. Apparatus as described in claim 1, further characterized by:

the tab extending less than half way around the via.

6. Apparatus as described in claim 5, further characterized by:

the tab extending around the via by greater than 0.1 mm, and by less than 0.3 mm.

7. Apparatus as described in claim 5, further characterized by:

the tab extending around the via by greater than 0.15 mm and by less than 0.3 mm.

8. Apparatus as described in claim 1, further characterized by:

the tab extending around the via by less than 0.3 mm.

9. Apparatus as described in claim 1, further characterized by:

at least one of the vias being non-contiguous from all circuit runs on said exterior surface.

* * * * *